(12) United States Patent
Michels et al.

(10) Patent No.: US 9,041,224 B2
(45) Date of Patent: May 26, 2015

(54) METHOD FOR PRODUCING A SOLDER JOINT

(71) Applicant: Robert Bosch GmbH, Stuttgart (DE)

(72) Inventors: Daniel Michels, Reutlingen (DE); Simon Green, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/348,679

(22) PCT Filed: Sep. 20, 2012

(86) PCT No.: PCT/EP2012/068577
§ 371 (c)(1),
(2) Date: Mar. 31, 2014

(87) PCT Pub. No.: WO2013/045348
PCT Pub. Date: Apr. 4, 2013

(65) Prior Publication Data
US 2014/0231976 A1    Aug. 21, 2014

(30) Foreign Application Priority Data

Sep. 29, 2011    (DE) .......................... 10 2011 083 791

(51) Int. Cl.
*H01L 23/488* (2006.01)
*H01L 23/00* (2006.01)
(Continued)

(52) U.S. Cl.
CPC . *H01L 24/27* (2013.01); *B24C 1/06* (2013.01); *B24C 11/00* (2013.01); *H01L 23/3142* (2013.01); *H01L 23/4334* (2013.01);
(Continued)

(58) Field of Classification Search
CPC .......... H01L 24/27; H01L 24/83; H01L 24/33
USPC ........................................... 257/779; 438/612
See application file for complete search history.

(56) References Cited

U.S. PATENT DOCUMENTS 4,911,353 A * 3/1990 Deakin ......................... 228/183
5,965,278 A * 10/1999 Finley et al. .................. 428/641
(Continued)

FOREIGN PATENT DOCUMENTS

DE    3931467    4/1991
DE    4142735    6/1993
(Continued)

OTHER PUBLICATIONS

3M: "Rocatec Bonding Scientific Product Profile," 3M ESPE, Scientific Affairs 12/01, Dec. 31, 2001, XP55048766, (German and English Translation, 54 pages).
(Continued)

*Primary Examiner* — Michele Fan
(74) *Attorney, Agent, or Firm* — Michael Best & Friedrich LLP

(57) ABSTRACT

A method for producing a solder joint between at least one base part (2) and at least one first component (3) includes the following steps: providing the base part (2); partially blasting a surface of the base part (2) using a SACO blasting agent, the blasting material (50) of which has a silicate coating (52), in such a way that a SACO-blasted region (20) and a non-blasted positioning region (40) are present; and soldering the at least first component (3) onto the non-blasted positioning region (40), wherein the SACO-blasted region (20) acts as a solder resist.

11 Claims, 4 Drawing Sheets

(51) Int. Cl.
*B24C 1/06* (2006.01)
*B24C 11/00* (2006.01)
*H01L 23/31* (2006.01)
*H01L 23/433* (2006.01)
*H01L 23/495* (2006.01)
*H01L 21/56* (2006.01)

(52) U.S. Cl.
CPC ..... *H01L23/49513* (2013.01); *H01L 23/49586* (2013.01); *H01L 24/33* (2013.01); *H01L 23/3107* (2013.01); *H01L 23/3121* (2013.01); *H01L 21/565* (2013.01); *H01L 2224/4847* (2013.01); *H01L 2224/8592* (2013.01); *H01L 24/83* (2013.01); *H01L 2224/83047* (2013.01)

(56) References Cited

U.S. PATENT DOCUMENTS

| | | | |
|---|---|---|---|
| 6,531,663 | B1 | 3/2003 | Isenberg et al. |
| 2004/0217455 | A1* | 11/2004 | Shiono et al. ............... 257/678 |

FOREIGN PATENT DOCUMENTS

| | | |
|---|---|---|
| DE | 4323064 | 1/1995 |
| DE | 4336901 | 5/1995 |
| DE | 102007001862 | 7/2008 |
| EP | 0326097 | 8/1989 |
| EP | 0687008 | 12/1995 |
| EP | 0987747 | 3/2000 |

OTHER PUBLICATIONS

"DELO-SACO—Simple blasting technique for the pretreatment of components for bonding," DELO Industrial Adhesives, Windach, Germany, Sep. 2009 <URL: http://www.delo.de/fileadmin/upload/dokumente/en/broschueren/DELO-SACO_Simple_blasting_technique.pdf> (German and English Translation, 4 pages).

International Search Report for Application No. PCT/EP2012/068577 dated Jan. 16, 2013 (3 pages).

* cited by examiner

METHOD FOR PRODUCING A SOLDER JOINT

BACKGROUND OF THE INVENTION

The present invention relates to a method for producing a solder joint between a base part and a component as well as to an electronic assembly and a mold module.

Methods for producing solder joints are known from the prior art in various embodiments. In this connection, electrical or electronic components, in particular power semiconductors, are soldered directly to metallic base parts, such as, for example, lead frames or heat sinks, and subsequently completely or partially encapsulated by a thermosetting plastic during, e.g., the manufacture of power modules for control devices in the automotive field. In so doing, the adhesiveness of the plastic to the base part is insufficient in many cases to absorb mechanical stresses resulting from varying thermal expansion coefficients of the components. Furthermore, there is also a risk of blurring the components during the soldering process. This can lead to a poor heat discharge/heat dissipation or an inhomogeneous thermal expansion if the component becomes blurred during the soldering process, e.g. to an edge of the base part. Blurring leads in many cases to components being discarded because the exact positioning of the component on the base part is no longer possible.

SUMMARY OF THE INVENTION

The method according to the invention has in contrast the advantage that a significant improvement in the adhesion of casing materials to a base part is achieved by means of a surface treatment and at the same time regions which are subjected to the surface treatment are no longer wettable with solders. According to the invention, this is achieved by virtue of the fact that a SACO blasting process (sand blast coating, e.g. of the Delo company) is carried out on a base part that has been provided by only partially blasting a surface of said base part using a SACO blasting agent in such a way that a SACO-blasted region and a non-blasted positioning region are present. The at least first component is subsequently soldered onto the non-SACO-blasted region of the base part, the SACO-blasted region acting as a solder resist. As a result, the blurring of the components can be prevented; and at the same time, the solder is effectively suppressed from running out into the SACO-blasted region and consequently the inhomogeneous thermal expansions resulting therefrom are suppressed. The base part and at least one component attached in such a manner to a non-SACO-blasted region of said base part preferably form an electronic assembly. A significantly improved adhesiveness of casing materials, in particular thermosetting plastics, is achieved on the blasted region by means of the silicate residue of the SACO blasting material that remains on said blasted region of the base part. In addition, an improved absorption of mechanical stresses, which are caused by varying thermal expansion coefficients of the components, is achieved in the base part.

The base part preferably comprises a plurality of sides and only one side of said base part comprises the SACO-blasted region and the non-blasted positioning region. Said base part further preferably comprises a plurality of sides, and a plurality of sides of said base part comprises SACO-blasted regions. As a result, one or a plurality of sides of the base part, which is preferably produced from a metallic material, can be provided in one single time and cost effective procedural step, wherein said side(s) has/have an improved adhesiveness with respect to plastic as well as surface properties which prevent a solder wetting. The method can thus be universally used for different designs of base parts.

In addition, the non-blasted positioning region is masked from the SACO blasting by means of a shadow mask. Masked base parts, which make it possible to perform the succeeding procedural step of blasting with high cycle times, can therefore be provided in a simple and operationally reliable manner. The shadow masks can furthermore be applied to the base parts with a minimal expenditure of time and material.

According to a preferred embodiment of the invention, at least two positioning regions are provided on the base part for attaching a first and second component. As a result, it is possible to produce base parts for a possible mounting of multiple components at minimum total cost and without significant additional expenditure of time; and in so doing, to preferably provide an electronic assembly.

A molding of a molded housing preferably takes place after soldering the component onto the positioning region. In so doing, the molded housing encloses at least a part of the base part, which is then protected from environmental impacts in the installed state, e.g. in a control device of a motor vehicle. As a result, a high operational reliability as well as durability of the assembly is ensured. In addition, parts of the surface of the base part do not have to be included within the surrounding molded housing; thus enabling an efficient dissipation of heat which develops in the components during operation to be ensured. Moreover, a delamination or debonding of material at the interface between the mold compound and the base part is effectively prevented.

The invention further relates to an electronic assembly, comprising at least one first component and a base part, wherein the base part comprises at least one region blasted with a SACO blasting agent, the blasting material of which has a silicate coating, and at least one non-blasted positioning region. The component is thereby disposed on the non-blasted positioning region, preferably by soldering, wherein silicate particles adhere to the SACO-blasted region.

According to a further preferred embodiment of the invention, the SACO-blasted region is free of solder. The SACO-blasted region provides a reliable local delimitation for the positioning surface of the components, which surface can be wetted with solder. As a result, a blurring of the components during the soldering process as well as a leakage of the solder from the positioning surface (solder resist) or the formation of solder rings around the components is reliably prevented.

The base part is preferably designed as a copper lead frame or as a copper heat sink. The base parts, e.g. in the form of power semiconductor elements, can therefore easily be directly soldered to the copper lead frame or the copper heat sink and can be accurately positioned without blurring.

In a further preferred manner, the base part has a plurality of sides, and only one side of the base part comprises the SACO-blasted region. In so doing, a single-sided soldering of the components as well as the contacting thereof, for example by means of an aluminum heavy wire bonding, and the soldering of copper clips or combinations thereof onto the base part can take place in a simple manner during manufacture.

A significantly improved adhesiveness of a casing material, for example a molded housing, results on the base part of the electronic assembly due to the surface properties of the blasted region. The molded housing thereby encloses at least a part of the base part, whereby a mold module is formed. In this way, the mold module is reliably sealed off and protected from ingressing environmental influences, which otherwise can cause malfunctions or a breakdown of the mold module. Thermosetting plastic materials are preferably provided to form the molded housing. The use of a thermosetting plastic material allows for the entire mold module to be encased in a heat resistant and operationally reliable manner.

BRIEF DESCRIPTION OF THE DRAWINGS

In the following, preferred exemplary embodiments of the invention are described in detail with reference to the accompanying drawings. In the drawings.

DETAILED DESCRIPTION

In the following, a mold module 1 according to the invention and a base part 2 according to a first preferred exemplary embodiment of the invention as well as a method for producing a solder joint are described in detail with reference to the FIGS. 1 to 6.

Figure 1:
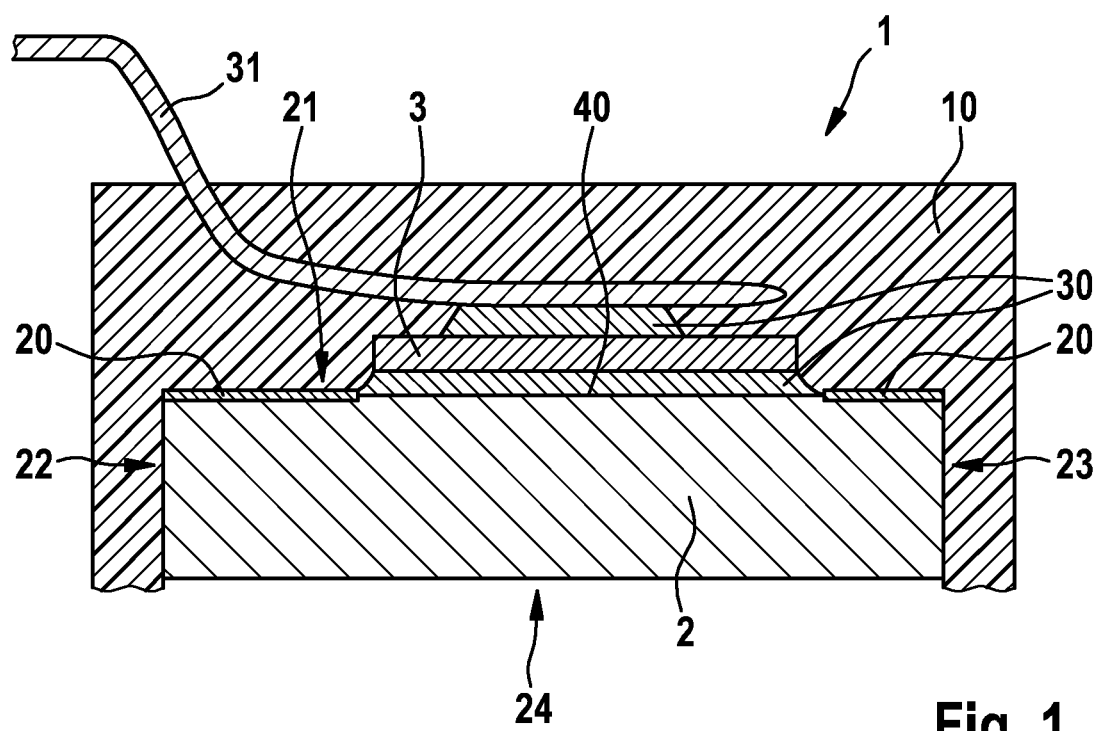
FIG. 1 shows an enlarged schematic sectional view of a mold module according to the invention.

As can be seen in the simplified schematic sectional depiction of the inventive mold module 1 of FIG. 1, the mold module comprises a molded housing 10 as well as a metallic base part 2 which is disposed in the interior of the molded housing 10. The base part 2 is thereby embodied as a copper heat sink. As can further be seen from FIG. 1, the molded housing 10 encloses a side 21 as well as the adjoining sides 22, 23 thereof of the base part 2, whereas a side 24 of the base part 2 which is opposite the side 21 is not enclosed by the molded housing 10.

Figure 2:
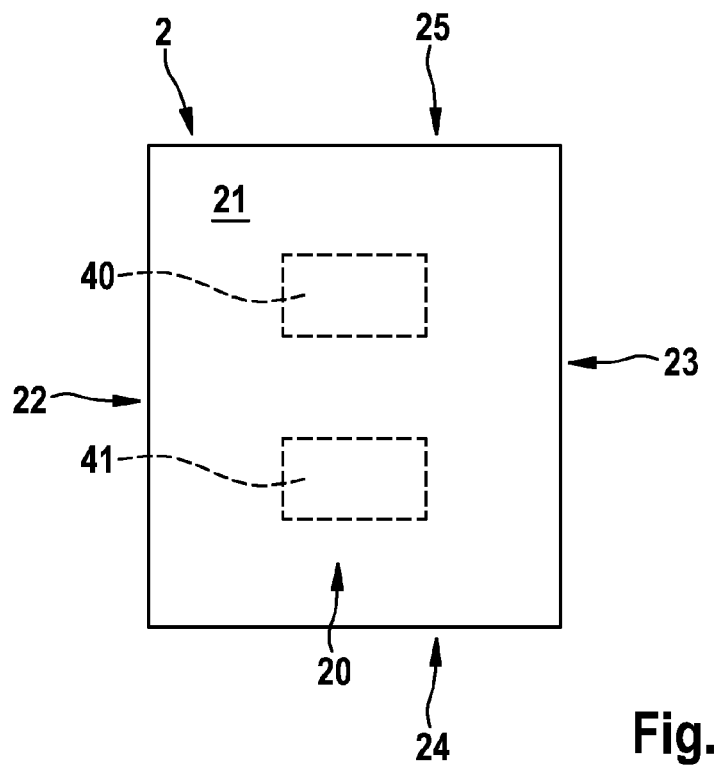
FIG. 2 shows an enlarged schematic top view of a base part according to a first preferred exemplary embodiment of the invention prior to a blasting process.

The side 21 of the base part 2 comprises in this first exemplary embodiment two substantially symmetrically disposed positioning regions 40, 41, on which a component 3 or, respectively, a second component, which is not visible here, is attached by means of a soldered joint 30, as well as a SACO blasted region 20 which surrounds the positioning regions 40, 41 as is depicted in FIG. 2. In addition, a connecting wire 31 on the base part 3 (or a further connecting wire on the second component which is not visible here) is attached via the solder joint 30 and guided out of the molded housing 10. The base part 2 can also alternatively be embodied as a copper lead frame.

Figure 4:
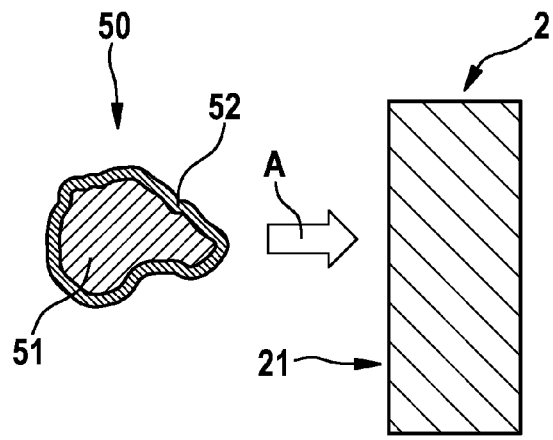
FIG. 4 shows an enlarged schematic depiction of a SACO blasting process prior to the impact of a blasting grain.

The positioning surfaces 40, 41 are masked during production by, e.g., a shadow mask in order to protect the copper surface thereof as a solder surface, whereas the remaining unmasked surface (which constitutes the later SACO-blasted region 20) is subjected to SACO sand blasting in order to improve the adhesiveness of said surface. In so doing, a special blasting agent comprising a blasting material 50 is used, from which each grain 51, as depicted in FIG. 4, is provided with a silicate coating 52 and is blasted onto the side 21 of the base part 2 in the direction of an arrow A.

Figure 3:
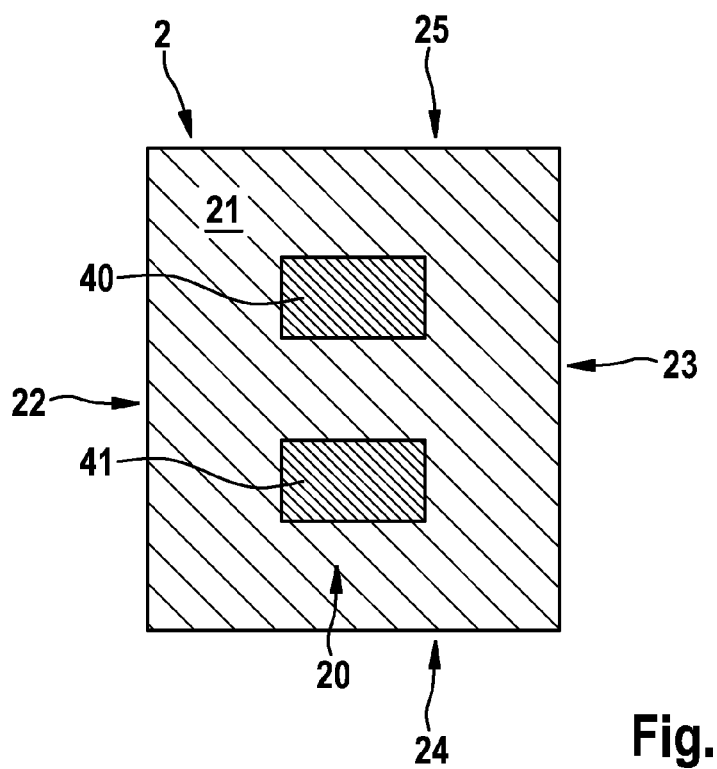
FIG. 3 shows an enlarged schematic top view of the base part of FIG. 2 after a blasting process.
Figure 5:
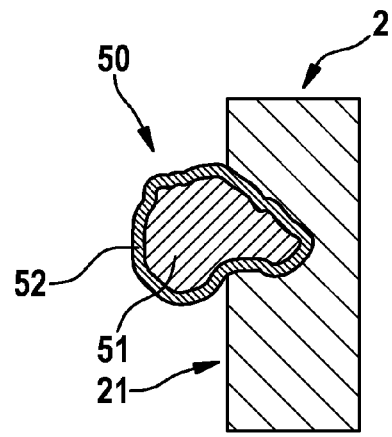
FIG. 5 shows an enlarged schematic depiction of the SACO blasting process upon impact of the blasting grain.
Figure 6:
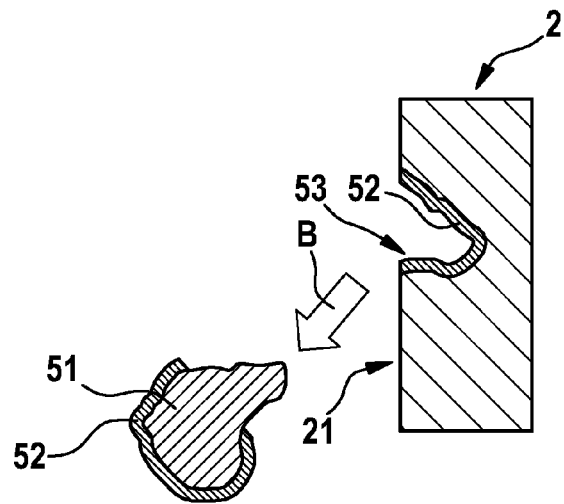
FIG. 6 shows an enlarged schematic depiction of the SACO blasting process after the impact of the blasting grain.

As is depicted in FIG. 5, the grain 51 thereby penetrates partially into the base part 2 upon impact. If the grain 51, as depicted in FIG. 6, in turn rebounds from the base part 2 in the direction of an arrow B, a portion of the silicate coating 52 remains in a recess 53 produced by means of the blasting process. In this way, the SACO-blasted region 20 depicted in FIG. 3 is produced. The SACO-blasted region 20 has on the one hand a raised surface roughness, which substantially improves the adhesiveness of plastics; and on the other hand, the remaining residue of the silicate coating 52 of each grain 51 of the blasting material 50 facilitates or improves the adhesiveness of plastics to a still greater extent and simultaneously make it impossible to wet said region with solder. Both features which include an improvement of adhesiveness of plastics, preferably on metal surfaces, and a solder resist on said surfaces are simultaneously provided by means of the method according to the invention. This is particularly advantageous for the production of mold modules which are used as power modules in control devices in the automotive field.

In the following, a base part of the mold module 1 according to a second preferred exemplary embodiment of the invention is described in detail with reference to FIGS. 7 and 8. Identical or functionally identical components are denoted here with the same reference numerals as in the first exemplary embodiment.

Figure 7:
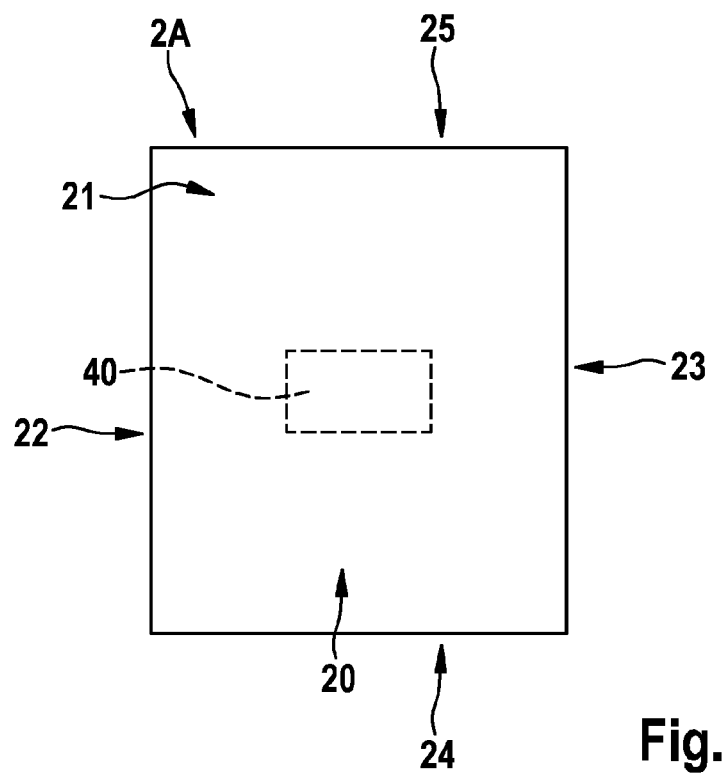
FIG. 7 shows an enlarged schematic top view of a component of the mold module according to a second exemplary embodiment of the invention prior to the blasting process.
Figure 8:
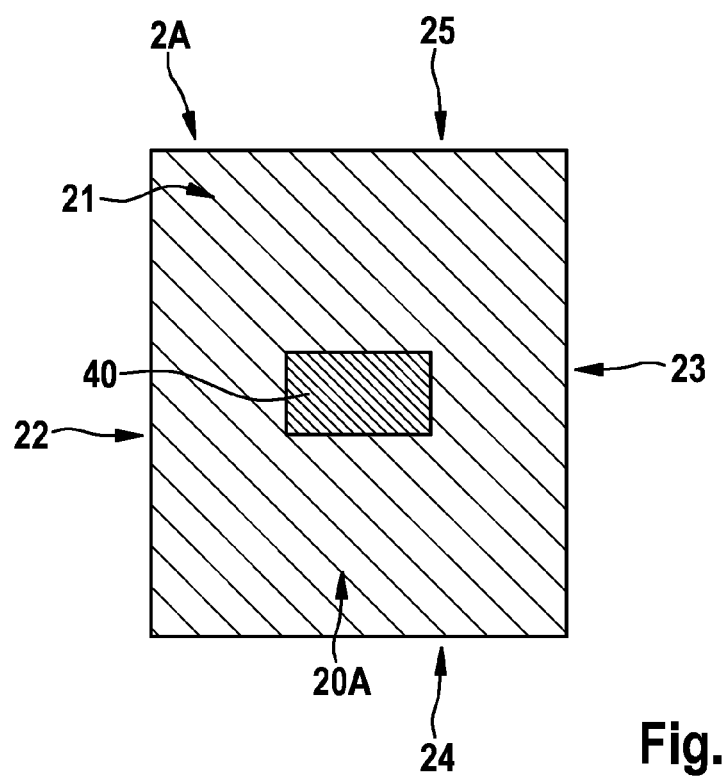
FIG. 8 shows an enlarged schematic top view of the base part from FIG. 7 after the blasting process.

In contrast to the previously described first exemplary embodiment, the second exemplary embodiment comprises only one single positioning surface 40, which is provided on the side 21 of a base part 2A, as is depicted in FIG. 7, and which is completely surrounded by a SACO-blasted region 20A after the blasting process, as is depicted in FIG. 8.

In principle, the embodiments according to FIGS. 3 and 8 are respectively conceivable without provision being made for a molded housing. In these cases, electronic assemblies are present in which a solder resist of an enclosed solder contact region is ensured by means of the SACO-blasted region 20 provided.

The invention claimed is:
1. A method for producing a solder joint between at least one base part and at least one first component, comprising the following steps:
   providing the base part,
   partially blasting a surface of the base part using a sand blast coating (SACO) blasting agent, said SACO blasting agent is a blasting material that has a silicate coating, in such a way that a SACO-blasted region and a non-blasted positioning region are present, and
   soldering the at least one first component onto the non-blasted positioning region,
   wherein the SACO-blasted region acts as a solder resist.

2. The method according to claim 1, characterized in that the base part comprises a plurality of sides and only one side of the base part comprises the SACO-blasted region and the non-blasted positioning region.

3. The method according to claim 1, characterized in that the base part comprises a plurality of sides and a plurality of sides of the base part comprises SACO-blasted regions.

4. The method according to claim 1, characterized in that the non-blasted positioning region is masked by means of a shadow mask prior to the SACO blasting.

5. The method according to claim 1, characterized in that at least two positioning regions are provided on the base part for attaching said at least one first component and a second component.

6. The method according to claim 1, further comprising molding a molded housing after soldering the component onto the non-blasted positioning region, wherein the molded housing adheres to the SACO-blasted region on the base element.

7. An electronic assembly comprising:
    at least one first component and
    a base part,
    wherein the base part comprises at least one region blasted using a sand blast coating (SACO) blasting agent, a blasted material that has a silicate coating, and at least one non-blasted positioning region,
    wherein the at least one first component is soldered onto the non-blasted positioning region,
    wherein silicate particles adhere to the SACO-blasted region and wherein the SACO-blasted region is not wettable with solder.

8. The electronic assembly according to claim 7, characterized in that the base part is embodied as a copper lead frame or as a copper heat sink.

9. The electronic assembly according to claim 7, characterized in that the base part comprises a plurality of sides and only one side of the base part comprises the SACO-blasted region.

10. A mold module, characterized in that said mold module comprises an electronic assembly according to claim 7 and a molded housing, wherein the molded housing adheres to the SACO-blasted region on the base element.

11. The mold module according to claim 10, characterized in that the molded housing is a thermosetting plastic.

* * * * *